(12) United States Patent
Hekmatshoartabari et al.

(10) Patent No.: US 10,608,111 B2
(45) Date of Patent: Mar. 31, 2020

(54) THIN FILM TRANSISTORS WITH EPITAXIAL SOURCE/DRAIN AND DRAIN FIELD RELIEF

(71) Applicant: International Business Machines Corporation, Armonk, NY (US)

(72) Inventors: Bahman Hekmatshoartabari, White Plains, NY (US); Ghavam G. Shahidi, Pound Ridge, NY (US); Marinus P. J. Hopstaken, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/217,701

(22) Filed: Dec. 12, 2018

(65) Prior Publication Data

US 2019/0172947 A1 Jun. 6, 2019

Related U.S. Application Data

(62) Division of application No. 15/833,120, filed on Dec. 6, 2017, now Pat. No. 10,224,430.

(51) Int. Cl.
*H01L 29/78* (2006.01)
*G02F 1/1362* (2006.01)
(Continued)

(52) U.S. Cl.
CPC ........ *H01L 29/7835* (2013.01); *C30B 23/025* (2013.01); *G02F 1/136277* (2013.01);
(Continued)

(58) Field of Classification Search
None
See application file for complete search history.

(56) References Cited

U.S. PATENT DOCUMENTS 4,814,842 A 3/1989 Nakagawa et al.
7,419,858 B2 9/2008 Schuele et al.
(Continued)

FOREIGN PATENT DOCUMENTS

EP 0212328 A1 3/1987

OTHER PUBLICATIONS

D. Shahrjerdi et al., "Low-Temperature Epitaxy of Compressively Strained Silicon Directly on Silicon Substrates," Journal of Electronic Materials, Mar. 2012, pp. 494-497, vol. 41, No. 3.
(Continued)

*Primary Examiner* — Telly D Green
(74) *Attorney, Agent, or Firm* — L. Jeffrey Kelly; Ryan, Mason & Lewis, LLP

(57) ABSTRACT

A method for manufacturing a semiconductor device includes forming a semiconductor layer on an insulating layer, epitaxially growing a first layer on the semiconductor layer, wherein the first layer has a first doping concentration, epitaxially growing a second layer on the semiconductor layer, wherein the second layer has a second doping concentration higher than the first doping concentration, forming a gate dielectric over an active region of the semiconductor layer, forming a gate electrode on the gate dielectric, and forming a plurality of source/drain contacts to the second layer, wherein the first and second layers comprise crystalline hydrogenated silicon (c-Si:H).

20 Claims, 15 Drawing Sheets

(51) Int. Cl.
  *H01L 21/02*   (2006.01)
  *C30B 23/02*   (2006.01)
  *H01L 29/66*   (2006.01)
  *H01L 29/786*  (2006.01)

(52) U.S. Cl.
  CPC ...... *H01L 21/0242* (2013.01); *H01L 21/0245* (2013.01); *H01L 21/0262* (2013.01); *H01L 21/02422* (2013.01); *H01L 21/02532* (2013.01); *H01L 21/02576* (2013.01); *H01L 21/02579* (2013.01); *H01L 29/66636* (2013.01); *H01L 29/66757* (2013.01); *H01L 29/786* (2013.01); *H01L 29/7848* (2013.01); *H01L 29/78621* (2013.01); *H01L 29/78675* (2013.01)

(56) References Cited

U.S. PATENT DOCUMENTS

| | | | |
|---|---|---|---|
| 7,863,113 B2 * | 1/2011 | Roca I Cabarrocas | H01L 29/66765 257/E29.292 |
| 8,008,157 B2 | 8/2011 | Liang et al. | |
| 8,115,188 B2 | 2/2012 | Gosain et al. | |
| 8,592,861 B2 | 11/2013 | Akimoto et al. | |
| 9,029,226 B2 | 5/2015 | Tsai et al. | |
| 9,093,548 B2 | 7/2015 | Hekmatshoartabari et al. | |
| 9,543,290 B2 * | 1/2017 | Hekmatshoartabari | H01L 29/8086 |
| 9,553,056 B1 | 1/2017 | Afzali-Ardakani et al. | |
| 9,748,281 B1 * | 8/2017 | Hekmatshoartabari | H01L 27/1222 |
| 10,038,104 B2 * | 7/2018 | Hekmatshoartabari | H01L 29/8086 |
| 10,082,918 B2 * | 9/2018 | Hekmatshoartabari | G06F 3/044 |
| 10,347,667 B2 * | 7/2019 | Hekmatshoartabari | H01L 29/66234 |
| 2006/0240602 A1 * | 10/2006 | Roca I Cabarrocas | H01L 29/66765 438/149 |
| 2015/0206947 A1 * | 7/2015 | Hekmatshoartabari | H01L 29/8086 257/66 |
| 2015/0279913 A1 * | 10/2015 | Gates | H01L 27/3248 257/40 |
| 2017/0092782 A1 * | 3/2017 | Hekmatshoartabari | H01L 29/8086 |
| 2018/0076237 A1 * | 3/2018 | Hekmatshoartabari | H01L 27/1222 |
| 2018/0129319 A1 * | 5/2018 | Hekmatshoartabari | G06F 3/044 |
| 2018/0130864 A1 * | 5/2018 | Hekmatshoartabari | H01L 27/3269 |
| 2018/0301567 A1 * | 10/2018 | Hekmatshoartabari | H01L 29/8086 |
| 2019/0035822 A1 * | 1/2019 | Hekmatshoartabari | H01L 29/66234 |
| 2019/0035823 A1 * | 1/2019 | Hekmatshoartabari | H01L 29/66234 |

OTHER PUBLICATIONS

List of IBM Parents or Patent Applications Treated as Related.

* cited by examiner

THIN FILM TRANSISTORS WITH EPITAXIAL SOURCE/DRAIN AND DRAIN FIELD RELIEF

TECHNICAL FIELD

The field generally relates to semiconductor devices and methods of manufacturing same and, in particular, to techniques for leveraging low temperature epitaxial growth to form source/drain and lightly doped drain regions.

BACKGROUND

Low-temperature poly-silicon (LTPS) thin-film transistors (TFTs) require high voltages for driving liquid crystal displays (LCDs) and electrophoretic displays, such as, for example, 8V-10V and 20-30V, respectively. High voltage operation is achieved by using relatively thick (e.g., >50 nm) gate dielectrics and drain-field relief structures, such as lightly doped drain (LDD) structures. Conventional source/drain and LDD structures require ion-implantation, which can be expensive. Additionally, activation of implanted doping requires high-temperatures or laser treatment. High temperatures necessitate using costly high-temperature glass carriers, and activation by laser treatment has controllability issues at high doping levels close to the solid solubility limit. Often, a combination of thermal annealing and laser treatment is used for activation, and overall the process can be expensive and complicated. In conventional LTPS TFT processes, at least two implantations followed by at least one activation step are needed to form n regions (LDD regions) and n++ regions (S/D regions).

SUMMARY

According to an exemplary embodiment of the present invention, a method for manufacturing a semiconductor device includes forming a semiconductor layer on an insulating layer, epitaxially growing a first layer on the semiconductor layer, wherein the first layer has a first doping concentration, epitaxially growing a second layer on the semiconductor layer, wherein the second layer has a second doping concentration higher than the first doping concentration, forming a gate dielectric over an active region of the semiconductor layer, forming a gate electrode on the gate dielectric, and forming a plurality of source/drain contacts to the second layer, wherein the first and second layers comprise crystalline hydrogenated silicon (c-Si:H).

According to an exemplary embodiment of the present invention, a semiconductor device includes a semiconductor layer on an insulating layer, a first doped layer on the semiconductor layer, wherein the first doped layer has a first doping concentration, a second doped layer on the semiconductor layer, wherein the second doped layer has a second doping concentration higher than the first doping concentration, a gate dielectric over an active region of the semiconductor layer, a gate electrode on the gate dielectric, and a plurality of source/drain contacts to the second layer, wherein the first doped layer comprises a lightly doped drain (LDD) region and the second doped layer comprises a source/drain region, and wherein the first and second doped layers comprise crystalline hydrogenated silicon (c-Si:H).

According to an exemplary embodiment of the present invention, a method for manufacturing a semiconductor device includes forming a semiconductor layer on an insulating layer, epitaxially growing a lightly doped drain (LDD) region on the semiconductor layer, wherein the lightly doped drain (LDD) region has a first doping concentration, epitaxially growing a source/drain region on the semiconductor layer, wherein the source/drain region has a second doping concentration higher than the first doping concentration, forming a gate dielectric over an active region of the semiconductor layer, forming a gate electrode on the gate dielectric, and forming a plurality of source/drain contacts to the source/drain region, wherein the lightly doped drain (LDD) and source/drain regions each comprise crystalline hydrogenated silicon (c-Si:H).

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
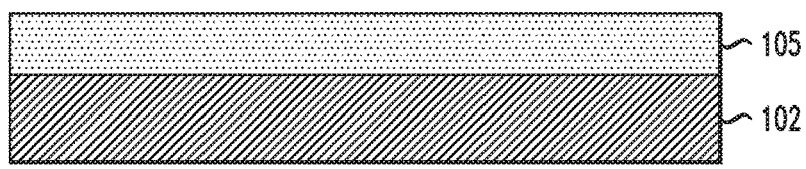
FIG. 1 is a cross-sectional view illustrating formation of a semiconductor layer on an insulating layer in a method of manufacturing a semiconductor device, according to an exemplary embodiment of the present invention.

Exemplary embodiments of the invention will now be discussed in further detail with regard to semiconductor devices and methods of manufacturing same and, in particular, to the formation of source/drain and lightly-doped drain regions using low temperature epitaxial growth.

It is to be understood that the various layers and/or regions shown in the accompanying drawings are not drawn to scale, and that one or more layers and/or regions of a type commonly used in, for example, a thin-film transistor (TFT), complementary metal-oxide semiconductor (CMOS), field-effect transistor (FET), nanowire FET, fin field-effect transistor (FinFET), metal-oxide-semiconductor field-effect transistor (MOSFET), vertical FET, single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, TFTs, FETs, FinFETs, nanowire FETs, nanosheet FETs, vertical FETs, SETs, CMOSs and/or MOSFETs. By way of non-limiting example, the semiconductor devices can include, but are not necessarily limited to TFT, FET, FinFET, nanowire FET, nanosheet FET, vertical FET, SET, CMOS and MOSFET devices, and/or semiconductor devices that use TFT, FET, FinFET, nanowire FET, nanosheet FET, vertical FET, SET CMOS and/or, MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the three-dimensional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the three-dimensional and/or cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Embodiments of the present invention relate to structures and methods that leverage low-temperature epitaxial growth of crystalline hydrogenated Si (referred to herein as "c-Si:H") to form source/drain and LDD regions. In some embodiments, c-Si:H may contain Ge, thus forming c-SiGe:H, preferably in concentrations less than 25 atomic percent (at. %) and more preferably less than 10 at. %. Typically, Ge is incorporated in p-type c-Si:H and not in n-type c-Si:H. The c-Si:H may also contain C, F, Cl, O, N, and combinations thereof, typically in concentrations below 1 at. %. Further elements, including deuterium (an isotope of H) may also be present in c-Si:H, if gas sources containing such elements are introduced into the gas mixture used for growth of c-Si:H. The hydrogenated Si containing material grown at low temperatures (referred to herein as "Si:H") may be crystalline or non-crystalline depending on the growth conditions and the crystallinity of the underlying substrate material. Crystalline hydrogenated Si may include hydrogenated single-crystalline Si and hydrogenated poly-crystalline Si. Non-crystalline hydrogenated Si may include hydrogenated amorphous Si, hydrogenated nano-crystalline Si and hydrogenated micro-crystalline Si.

The embodiments of the present invention eliminate the need for expensive and complicated implantation and activation steps, and substantially reduce the high temperature requirements of the substrate. For example, the low-temperature epitaxial growth of the highly doped c-Si:H layers and moderately doped c-Si:H layers may be performed using plasma-enhanced chemical vapor deposition (PECVD) at temperatures below 450° C., such as, 150° C.-350° C., in some embodiments.

In a non-limiting example, c-Si:H may achieve active doping levels of about $1\times10^{19}$ cm$^{-3}$ to about $5\times10^{20}$ cm$^{-3}$, for example, $2\times10^{20}$ cm$^{-3}$, at growth temperatures as low as about 150° C. in order to form a highly doped S/D region (e.g., n++). Moderately doped LDD regions (e.g., n) at active doping levels of about $5\times10^{17}$ cm$^{-3}$ to about $1\times10^{19}$ cm$^{-3}$, may be grown using the same equipment or chamber as the highly doped material (e.g., c-Si:H) by reducing, for example, the PH$_3$/SiH$_4$ flow ratio. For p-channel devices, such as p-channel FETs, p+ and p c-Si:H are used for S/D and LDD regions, respectively, instead of n+ and n c-Si:H.

In connection with the embodiments of the present invention discussed herein, dimensions may be, but are not necessarily limited to, the following, where thickness indicates vertical height with respect to an underlying surface in the drawings: channel length: ≥2 μm, dielectric thickness: about 50 nm-about 300 nm, LTPS thickness: abut 35 nm-about 70 nm, S/D (highly doped) and LDD (moderately doped) epitaxial layer thickness: about 10 nm-about 30 nm. Spacer width (horizontal width in the cross-sectional views) can be in the range of, but is not necessarily limited to, about 100 nm-about 500 nm.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For instance, c-Si:H having single-crystalline form may be grown epitaxially on single-crystalline Si (also known as mono-crystalline Si) substrates, and c-Si:H having polycrystalline form may be grown epitaxially on low-temperature poly-Si (LTPS) substrates.

The epitaxial deposition process may employ the deposition chamber of a chemical vapor deposition type apparatus, such as a PECVD apparatus. A number of different sources may be used for the epitaxial deposition of an in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, ldisilane and combinations thereof. By "in-situ", it is meant that the dopant that dictates the conductivity type of the doped layer is introduced during the process step, e.g., epitaxial deposition, that forms the doped layer.

FIG. 1 is a cross-sectional view illustrating formation of a semiconductor layer on an insulating layer in a method of manufacturing a semiconductor device, according to an exemplary embodiment of the present invention. Referring to FIG. 1, the semiconductor device 100 includes a semiconductor layer 105, at least part of which forms a channel (active region) of a transistor where a gate will be formed. The semiconductor devices may be isolated from each other by patterning the semiconductor layer 105, or defining isolation regions, such as, for example shallow trench isolation (STI) regions. The semiconductor layer 105 includes a semiconductor material, including, but not necessarily limited to silicon (Si), silicon germanium (SiGe), germanium (Ge), gallium arsenide (GaAs), silicon carbide (SiC), Si:C (carbon doped silicon), silicon germanium carbide (SiGeC), carbon doped silicon germanium (SiGe:C), III-V, II-V compound semiconductor or other like semiconductor, and is formed on an insulating layer 102. The insulating layer 102 can be an insulating carrier, including, but not necessarily limited to, glass, plastic, buried oxide, buried nitride, or other insulator. Embodiments of the present invention are also applicable to bulk semiconductors.

The semiconductor layer 105 may be single crystalline or poly crystalline. In accordance with an embodiment of the present invention, the semiconductor layer comprises low-temperature poly-Si (LTPS), which can be prepared by excimer laser crystallization.

Figure 2:
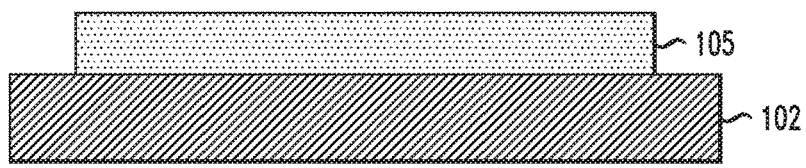
FIG. 2 is a cross-sectional view illustrating patterning of a semiconductor layer in a method of manufacturing a semiconductor device, according to an exemplary embodiment of the present invention.

FIG. 2 is a cross-sectional view illustrating patterning of a semiconductor layer in a method of manufacturing a semiconductor device, according to an exemplary embodiment of the present invention. Referring to FIG. 2, portions of the semiconductor layer 105 (e.g., LTPS) are removed to pattern the semiconductor layer 105 into active regions. In accordance with a non-limiting embodiment of the present invention, the semiconductor layer 105 is patterned by lithography using a dry etch, such as with CF$_4$ plasma, CHF$_3$/SF$_6$ plasma or SF$_6$/O$_2$ plasma, or a wet-etch, such as with tetramethylammonium hydroxide (TMAH). Etching with TMAH may require a hard mask such as a dielectric (not shown), as TMAH may attack some photoresists.

Figure 3A:
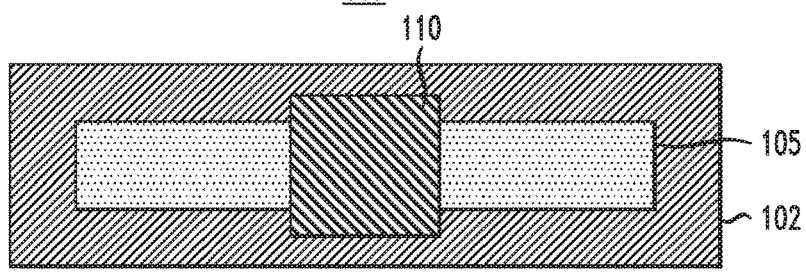
FIGS. 3A and 3B are top and cross-sectional views, respectively, illustrating deposition and patterning of a dielectric layer in a method of manufacturing a semiconductor device, according to an exemplary embodiment of the present invention.
Figure 3B:
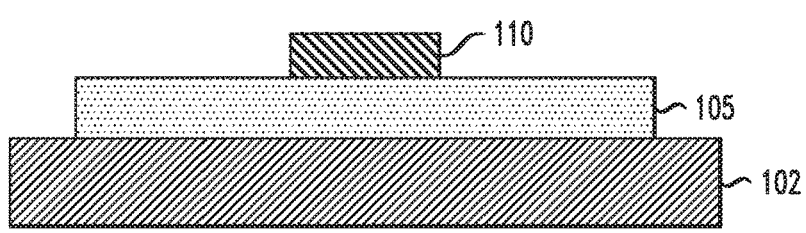

FIGS. 3A and 3B are top and cross-sectional views, respectively, illustrating deposition and patterning of a dielectric mask layer in a method of manufacturing a semiconductor device, according to an exemplary embodiment of the present invention. Referring to FIGS. 3A and 3B, a dielectric mask layer is deposited using, for example, deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. The dielectric mask layer is patterned using techniques such as etching (e.g., reactive ion etching (RIE)) and lithography. As shown in FIG. 3A, the dielectric mask 110 may be patterned wider than the active region of the semiconductor layer 105 (e.g., LTPS) to avoid c-Si:H growth on sidewalls of the semiconductor layer 105 between source/drain regions. c-Si:H grown on exposed sidewalls between source/drain regions would create an unwanted electrical path between the two source/drain regions. The dielectric mask 110 can comprise, for example, a dielectric material, such as, but not necessarily limited to, silicon dioxide (SiO$_2$), silicon nitride (SiN), silicon oxynitride or any suitable combination of those materials.

Figure 4:
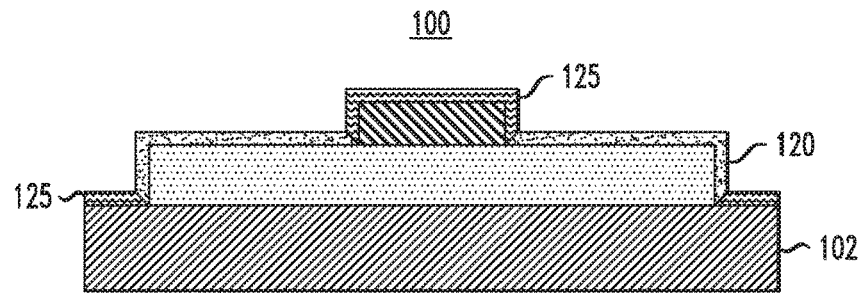
FIG. 4 is a cross-sectional view illustrating formation of moderately doped crystalline hydrogenated silicon (c-Si:H) on exposed parts of the semiconductor layer and non-crystalline Si:H on other portions in a method of manufacturing a semiconductor device, according to an exemplary embodiment of the present invention.
Figure 6:
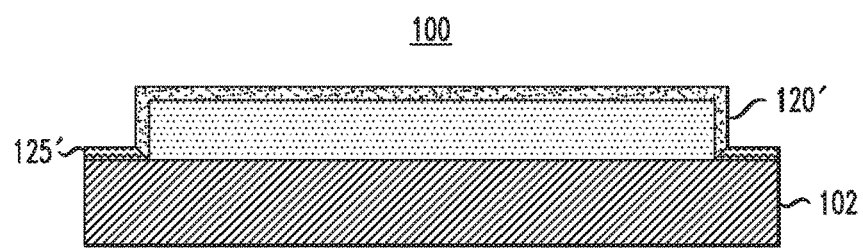
FIG. 6 is a cross-sectional view illustrating formation of moderately doped c-Si:H on exposed parts of the semiconductor layer and non-crystalline Si:H on other portions in a method of manufacturing a semiconductor device, according to an exemplary embodiment of the present invention.

FIG. 4 is a cross-sectional view illustrating formation of moderately doped crystalline hydrogenated silicon (c-Si:H) on exposed parts of the semiconductor layer and non-crystalline Si:H on other portions in a method of manufacturing a semiconductor device, according to an exemplary embodiment of the present invention. Referring to FIG. 4, moderately doped c-Si:H epitaxial layer 120 is selectively formed on the exposed portions of the semiconductor layer 105. Non-crystalline hydrogenated silicon 125 is formed on other portions, such as insulating layer 102 and the dielectric mask 110. Hydrogenated silicon (Si:H) is grown, for example, using PECVD, which results in crystalline (single or poly) growth on the exposed parts on the semiconductor layer 105 (e.g., LTPS) and in non-crystalline growth elsewhere. Other techniques such as, for example, hot-wire chemical vapor deposition (HWCVD) may also be used to grow Si:H. FIGS. 4 and 6 illustrate tapered edges of the epitaxial layers 120, 125 between crystalline and non-crystalline portions. However, for simplicity, the tapered edges of the epitaxial Si:H layers are not illustrated in the other figures herein.

As explained in more detail herein, the LDD regions include the moderately doped c-Si:H epitaxial layers. In accordance with an embodiment of the present invention, the total and active doping concentration of the LDD regions is in the range of $5 \times 10^{17}$ to $1 \times 10^{19}$ cm$^{-3}$. The moderately doped c-Si:H is grown from a mixture of carrier gas (e.g., $H_2$), a precursor gas (e.g., $SiH_4$), and a dopant gas (e.g., $PH_3$), where the gas flow ratio is 1 ppm<[$PH_3$]/[$SiH_4$]<100 ppm, and the gas flow ratio [$H_2$]/[$SiH_4$]>5. In embodiments where c-Si:H contains Ge, a mixture of carrier gas (e.g., $H_2$), precursor gases (e.g., $SiH_4$ and $GeH_4$), and a dopant gas (e.g., $B_2H_6$), where 1 ppm<[$B_2H_6$]/([$SiH_4$]+[$GeH_4$])<100 ppm, and [$H_2$]/([$SiH_4$]+[$GeH_4$])>5 is used for the growth. In addition, in accordance with an embodiment of the present invention, the c-Si:H containing material contains about 5 to about 40 atomic percent hydrogen.

Figure 5:
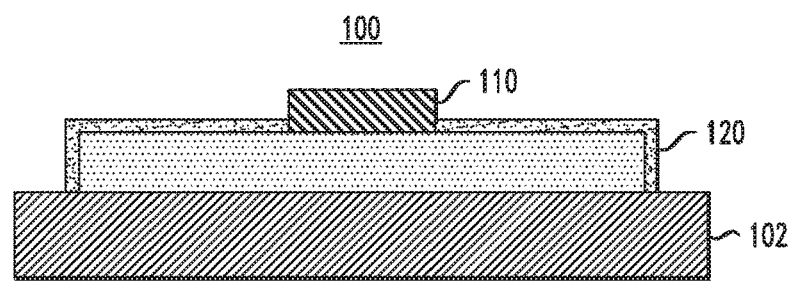
FIG. 5 is a cross-sectional view illustrating removal of non-crystalline Si:H in a method of manufacturing a semiconductor device, according to an exemplary embodiment of the present invention.

FIG. 5 is a cross-sectional view illustrating removal of non-crystalline Si:H in a method of manufacturing a semiconductor device, according to an exemplary embodiment of the present invention. Referring to FIG. 5, the non-crystalline portions 125 of Si:H are selectively removed using an appropriate dry or wet etch. In one example, etching is performed in-situ using an $H_2$ plasma. The dielectric mask 110 is then removed using an etch chemistry that does not attack the remaining epitaxial c-Si:H 120, such as, for example, hydrofluoric acid (HF).

FIG. 6 is a cross-sectional view illustrating formation of moderately doped crystalline Si:H on exposed parts of the semiconductor layer and non-crystalline Si:H on other portions in a method of manufacturing a semiconductor device, according to an exemplary embodiment of the present invention. Referring to FIG. 6, as an alternative to the processing in FIGS. 3-5, crystalline Si:H 120' and non-crystalline Si:H 125' is grown without the dielectric mask 110 masking a portion of the semiconductor layer 105.

Figure 7:
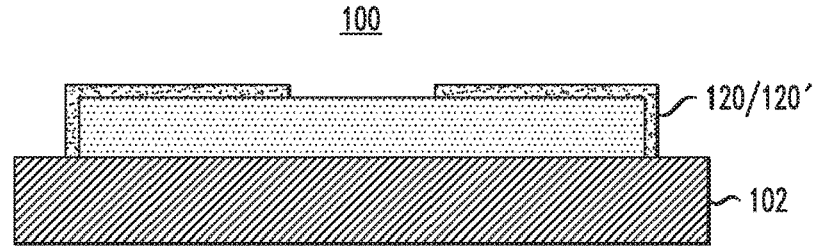
FIG. 7 is a cross-sectional view illustrating the resulting structure after removing the dielectric mask from FIG. 5 or patterning of portions of deposited Si:H from FIG. 6 in a method of manufacturing a semiconductor device, according to an exemplary embodiment of the present invention.

FIG. 7 is a cross-sectional view illustrating the resulting structure after removing the dielectric mask from FIG. 5 in a method of manufacturing a semiconductor device, according to an exemplary embodiment of the present invention. Alternatively, when following from FIG. 6, FIG. 7 illustrates patterning of portions of deposited Si:H from FIG. 6 in a method of manufacturing a semiconductor device, according to an exemplary embodiment of the present invention. Referring to FIG. 7, when following from FIG. 6, the non-crystalline portions 125' of the Si:H and part of the crystalline portion 120' of the Si:H corresponding to an active region are selectively removed using lithography and an etch recipe which is highly selective to the material of the semiconductor layer 105 (e.g., LTPS). In accordance with an embodiment of the present invention, the Si:H portions 120' and 125' are etched using a dilute (e.g., 1 molar (M)) KOH solution. Etching with KOH may require a hard mask (e.g., dielectric), as KOH may attack some photoresists.

Figure 8A:
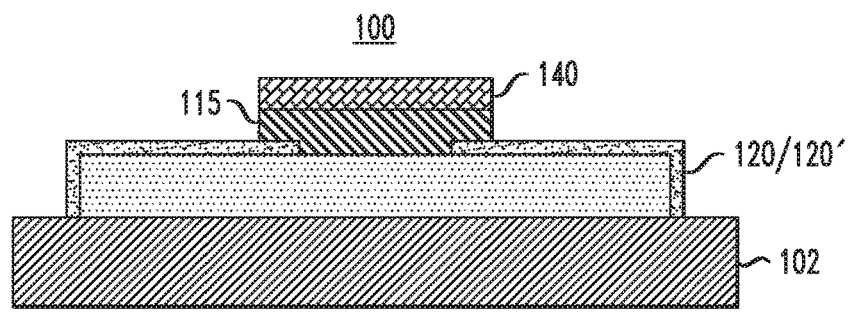
FIG. 8A is a cross-sectional view illustrating deposition and patterning of a gate dielectric and gate electrode in a method of manufacturing a semiconductor device, according to an exemplary embodiment of the present invention.

FIG. 8A is a cross-sectional view illustrating deposition and patterning of a gate dielectric and gate electrode in a method of manufacturing a semiconductor device, according to an exemplary embodiment of the present invention. Referring to FIG. 8A, gate dielectric and gate electrode materials (e.g., metal) are deposited on the structure of FIG. 7 using, for example, deposition techniques including, but not limited to, CVD, PECVD, RFCVD, PVD, ALD, MLD, MBD, PLD, LSMCD, and/or sputtering. The deposited layers can be patterned into the gate dielectric 115 and gate electrode 140. The patterning can be performed using, for example, lithography and etching (e.g., RIE).

In some embodiments, an additional dielectric layer is deposited on the gate electrode, to form a dielectric/metal/dielectric tri-layer to protect the metal against wet cleaning and/or HF dip steps that may be used subsequently to remove organic residues from lithography or native/chemical oxide layers.

The gate electrode material can comprise, for example, a work-function-determining metal (WFM) layer, including but not necessarily limited to, for a PFET, titanium nitride (TiN), tantalum nitride (TaN) or ruthenium (Ru), and for an NFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, and/or a metal layer, including but not necessarily limited to, chromium, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof. The gate electrode material may also include highly doped poly-Si. The gate dielectric 115 can comprise, for example, a dielectric material, such as, but not necessarily limited to, silicon dioxide ($SiO_2$), silicon oxynitride, $HfO_2$ (hafnium oxide), $ZrO_2$ (zirconium dioxide), hafnium zirconium oxide, $Al_2O_3$ (aluminum oxide), $Ta_2O_5$ (tantalum pentoxide), hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate or any suitable combination of those materials.

Figure 8B:
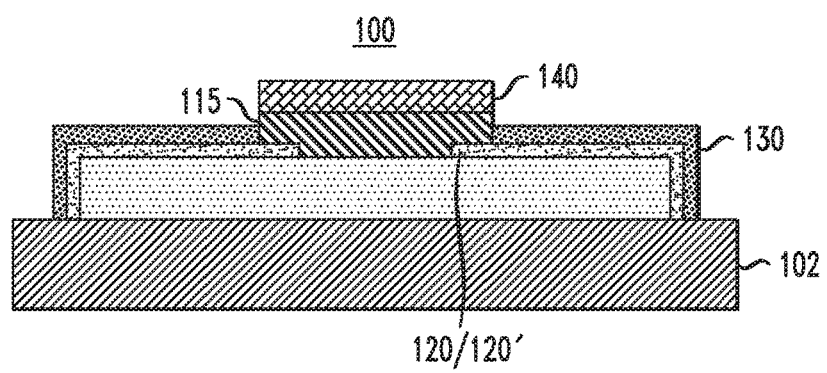
FIG. 8B is a cross-sectional view illustrating selective formation of a highly doped c-Si:H layer in a method of manufacturing a semiconductor device, according to an exemplary embodiment of the present invention.

FIG. 8B is a cross-sectional view illustrating selective formation of a highly doped Si:H layer in a method of manufacturing a semiconductor device, according to an exemplary embodiment of the present invention. Referring to FIG. 8B, highly doped c-Si:H epitaxial layer 130 is selectively formed for source/drain regions on the exposed portions of the moderately doped c-Si:H layer 120/120'. Non-crystalline hydrogenated silicon (not shown) is formed on other portions, such as insulating layer 102 and the gate electrode 140. Similar to the growth of layers 120 and 125 discussed in connection with FIG. 4, the hydrogenated silicon (Si:H) is grown, for example, using PECVD, which results in crystalline (single or poly) growth on the exposed parts on the layer 120/120' and in non-crystalline growth elsewhere. Other techniques such as, for example, hot-wire chemical vapor deposition (HWCVD) may also be used to grow Si:H. The non-crystalline portions of Si:H are selectively removed using an appropriate dry or wet etch. In one example, etching is performed in-situ using an $H_2$ plasma.

As explained in more detail herein, the source/drain regions include the highly doped c-Si:H epitaxial layers 130. In accordance with an embodiment of the present invention, the total doping concentration of the source/drain regions is in the range of $1 \times 10^{20}$ to $1 \times 10^{21}$ cm$^{-3}$ and the active doping concentration of the source/drain regions is in the range of $1 \times 10^{19}$ to $5 \times 10^{20}$ cm$^{-3}$. The highly doped c-Si:H is grown from a mixture of carrier gas (e.g., H$_2$), a precursor gas (e.g., SiH$_4$), and a dopant gas (e.g., PH$_3$), where the gas flow ratio is [PH$_3$]/[SiH$_4$]>1000 ppm, and the gas flow ratio [H$_2$]/[SiH$_4$]>5. In embodiments where c-Si:H contains Ge, highly-doped c-SiGe:H is grown from a mixture of carrier gas (e.g., H$_2$), precursor gases (e.g., SiH$_4$ and GeH$_4$), and a dopant gas (e.g., B$_2$H$_6$), [B$_2$H$_6$]/([SiH$_4$]+[GeH$_4$])>1000 ppm, and [H$_2$]/([SiH$_4$]+[GeH$_4$])>5. In addition, in accordance with an embodiment of the present invention, as with the moderately doped c-Si:H, the c-Si:H containing material for the highly doped c-Si:H contains about 5 to about 40 atomic percent hydrogen.

Figure 9:
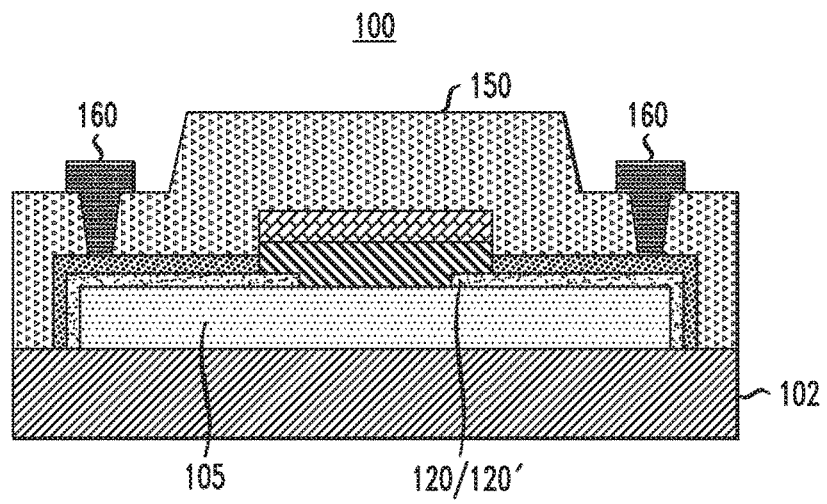
FIG. 9 is a cross-sectional view illustrating formation of a passivation layer and source/drain contact regions in a method of manufacturing a semiconductor device, according to an exemplary embodiment of the present invention.

FIG. 9 is a cross-sectional view illustrating formation of a passivation layer and source/drain contact regions in a method of manufacturing a semiconductor device, according to an exemplary embodiment of the present invention. The passivation layer 150 can be deposited using deposition techniques including, but not limited to, CVD, PECVD, RFCVD, PVD, ALD, MLD, MBD, PLD, LSMCD, and/or sputtering. The passivation layer 150 can include, but is not necessarily limited to, silicon dioxide (SiO$_2$), low-temperature oxide (LTO), high-temperature oxide (HTO), field oxide (FOX) or some other dielectric. In some embodiments, a hard mask (not shown) comprising, for example, silicon nitride (SiN), covers portions of the passivation layer 150, and leaves exposed a portion of the passivation layer 150 corresponding to left and right source/drain regions on either side of the gate (e.g., active) region. Using a timed etch process, such as, for example, RIE, the exposed portions of the passivation layer 150 are etched to form contact trenches down to the highly doped c-Si:H layer 130, which are filled with a contact material, such as, for example, electrically conductive material including, but not necessarily limited to, tungsten, cobalt, zirconium, tantalum, titanium, aluminum, ruthenium, and/or copper to form source/drain contacts 160. In some embodiments, vias are etched into the passivation layer without a hard mask, and the etch process includes an etch chemistry which is selective to c-Si:H, such as buffered oxide etch (BOE).

Figure 10A:
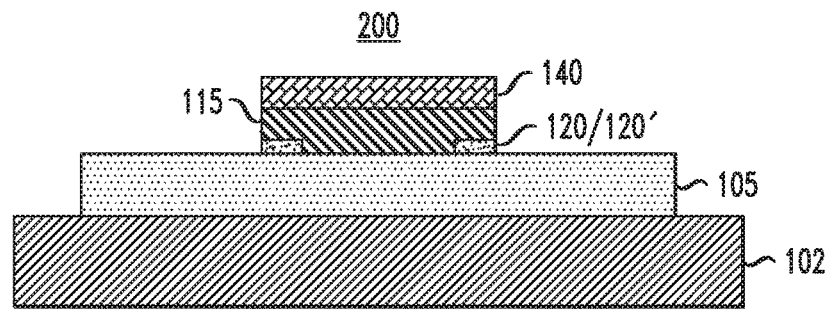
FIG. 10A is a cross-sectional view illustrating removal of portions of the moderately doped c-Si:H layer in a method of manufacturing a semiconductor device, according to an exemplary embodiment of the present invention.

FIG. 10A is a cross-sectional view illustrating removal of portions of the moderately doped Si:H layer in a method of manufacturing a semiconductor device, according to an exemplary embodiment of the present invention. Referring to FIG. 10A, in connection with a device 200, following processing from FIG. 8A, the exposed portions of the moderately doped c-Si:H layer 120/120' not covered by the dielectric layer are removed using an etch selective to the semiconductor layer 105 (e.g., LTPS), such as, but not necessarily limited to, 1M KOH solution.

Figure 10B:
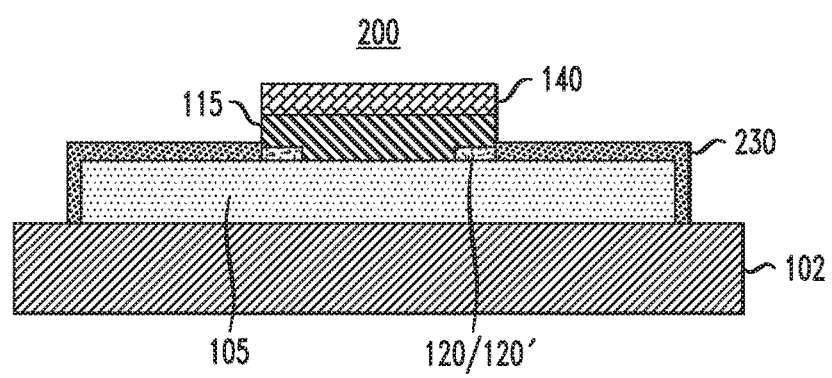
FIG. 10B is a cross-sectional view illustrating selective formation of a highly doped c-Si:H layer in a method of manufacturing a semiconductor device, according to an exemplary embodiment of the present invention.

FIG. 10B is a cross-sectional view illustrating selective formation of a highly doped Si:H layer in a method of manufacturing a semiconductor device, according to an exemplary embodiment of the present invention. Referring to FIG. 10B, a highly doped c-Si:H epitaxial layer 230 is then selectively formed similar to the formation of the layer 130 described in connection with FIG. 8B, except that the layer 230 is formed on the exposed portions of the semiconductor layer 105, since the exposed moderately doped c-Si:H layer 120/120' was removed. In some embodiments, this approach allows growth of a thicker (e.g., greater vertical height) highly doped c-Si:H layer than when the exposed portions of the moderately doped c-Si:H layer 120/120' are not removed. The thicker highly doped c-Si:H layer 230 can cause lower S/D series resistance. The c-Si:H epitaxy may have a critical thickness due to the accumulation of compressive strain originating from the presence of hydrogen in c-Si:H.

Figure 11:
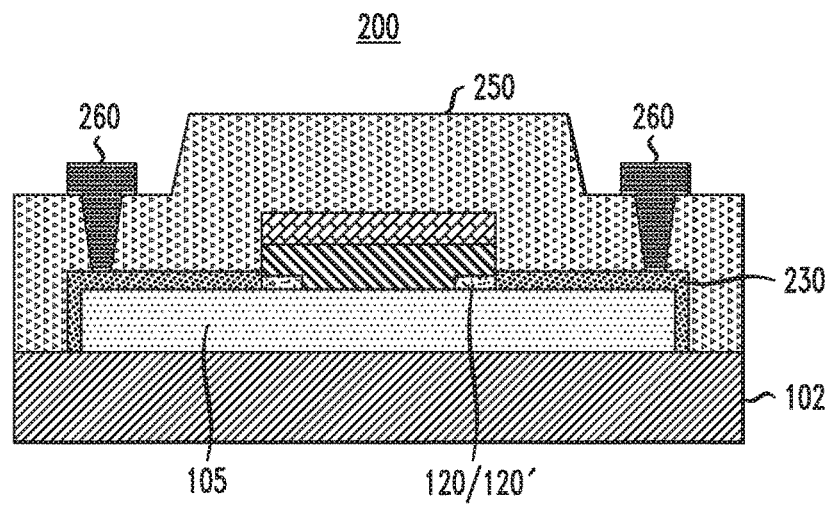
FIG. 11 is a cross-sectional view illustrating formation of a passivation layer and source/drain contact regions in a method of manufacturing a semiconductor device, according to an exemplary embodiment of the present invention.

FIG. 11 is a cross-sectional view illustrating formation of a passivation layer and source/drain contact regions in a method of manufacturing a semiconductor device, according to an exemplary embodiment of the present invention. Referring to FIG. 11, a passivation layer 250 and source/drain contacts 260 to the highly doped c-Si:H layer 230 are formed using the same or similar steps and materials as those described in connection with the embodiment of FIG. 9.

Figure 12:
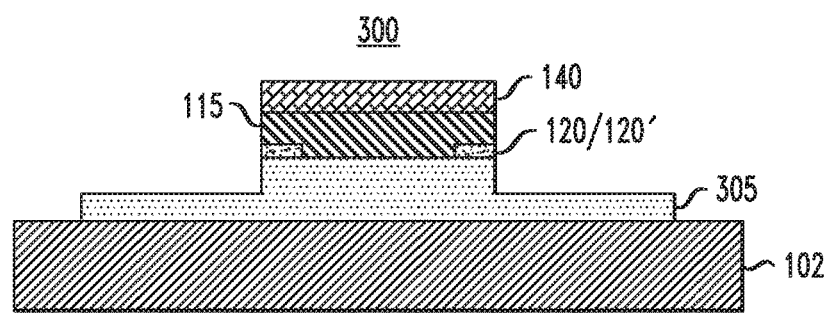
FIG. 12 is a cross-sectional view illustrating removal of portions of the moderately doped c-Si:H layer and portions of the semiconductor layer in a method of manufacturing a semiconductor device, according to an exemplary embodiment of the present invention.

FIG. 12 is a cross-sectional view illustrating removal of portions of the moderately doped Si:H layer and portions of the semiconductor layer in a method of manufacturing a semiconductor device, according to an exemplary embodiment of the present invention.

Referring to FIG. 12, in connection with a device 300, following processing from FIG. 8A, the exposed portions of the moderately doped c-Si:H layer 120/120' not covered by the dielectric layer are etched using an etch which is not selective to the semiconductor layer 305 (e.g., LTPS), such as, but not necessarily limited to, TMAH, CF$_4$ plasma, SF$_6$/CHF$_3$ plasma or SF$_6$/O$_2$ plasma. As can be seen in FIG. 12, the semiconductor layer 305 is partially etched, thereby recessing portions of the semiconductor layer were under the exposed portions of the moderately doped c-Si:H layer 120/120'.

Figure 13:
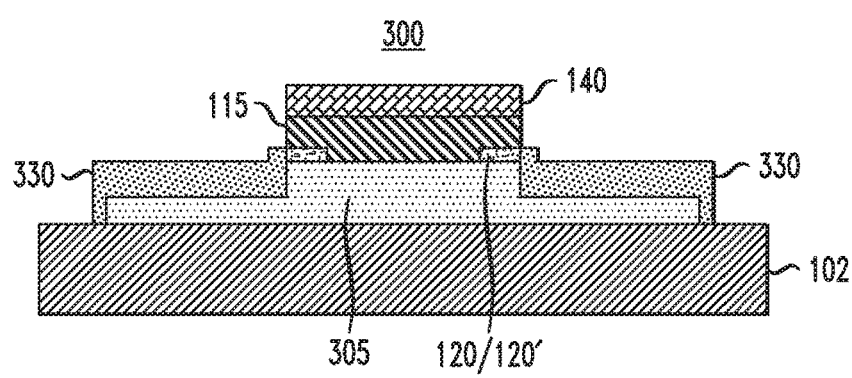
FIG. 13 is a cross-sectional view illustrating selective formation of a highly doped c-Si:H layer in a method of manufacturing a semiconductor device, according to an exemplary embodiment of the present invention.

FIG. 13 is a cross-sectional view illustrating selective formation of a highly doped Si:H layer in a method of manufacturing a semiconductor device, according to an exemplary embodiment of the present invention. Referring to FIG. 13, a highly doped c-Si:H epitaxial layer 330 is then selectively formed similar to the formation of the layer 230 described in connection with FIG. 10B, except that the semiconductor layer 305 is recessed and layer 330 is formed on the recessed portions, including lateral sidewalls of the recessed portions. As noted in connection with FIG. 10B, in some embodiments, this approach allows growth of a thicker highly doped c-Si:H layer, which reduces S/D series resistance. In addition, the recessed S/D geometry reduces current crowding and therefore further reduces S/D series resistance, in some embodiments.

Figure 14:
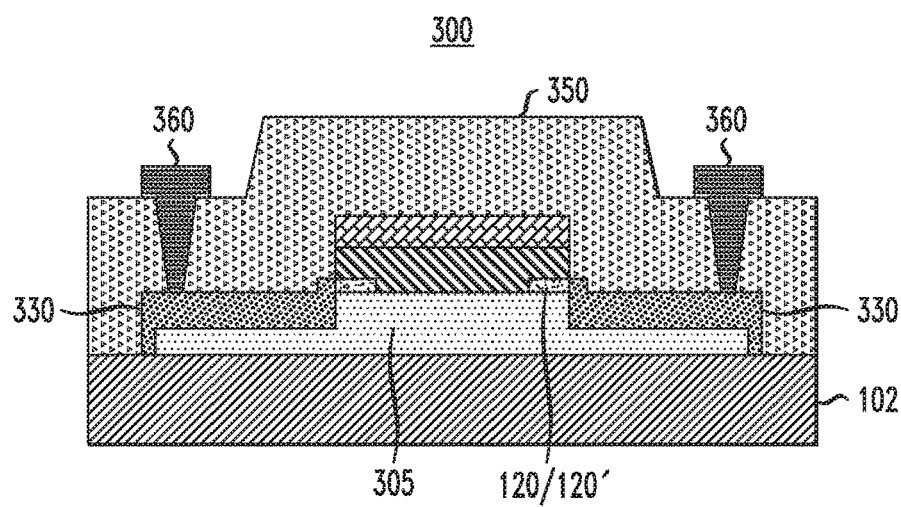
FIG. 14 is a cross-sectional view illustrating formation of a passivation layer and source/drain contact regions in a method of manufacturing a semiconductor device, according to an exemplary embodiment of the present invention.

FIG. 14 is a cross-sectional view illustrating formation of a passivation layer and source/drain contact regions in a method of manufacturing a semiconductor device, according to an exemplary embodiment of the present invention. Referring to FIG. 14, a passivation layer 350 and source/drain contacts 360 to the highly-doped c-Si:H layer 330 are formed using the same or similar steps and materials as those described in connection with the embodiments of FIGS. 9 and 11.

Figure 15:
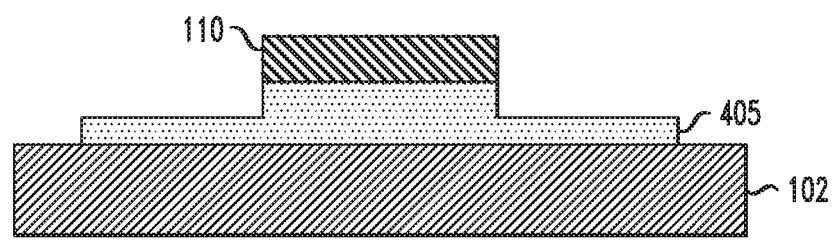
FIG. 15 is a cross-sectional view illustrating removal of portions of the semiconductor layer, according to an exemplary embodiment of the present invention.

FIG. 15 is a cross-sectional view illustrating removal of portions of the semiconductor layer, according to an exemplary embodiment of the present invention. Referring to FIG. 15, in connection with a device 400, following processing from FIGS. 3A and 3B, the semiconductor layer 405 is recessed using an etch chemistry including, but not necessarily limited to, TMAH, CF$_4$ plasma, SF$_6$/CHF$_3$ plasma or SF$_6$/O$_2$ plasma. As can be seen in FIG. 15, the semiconductor layer 405 is partially etched, thereby recessing portions of the semiconductor layer not under the dielectric mask 110.

Figure 16:
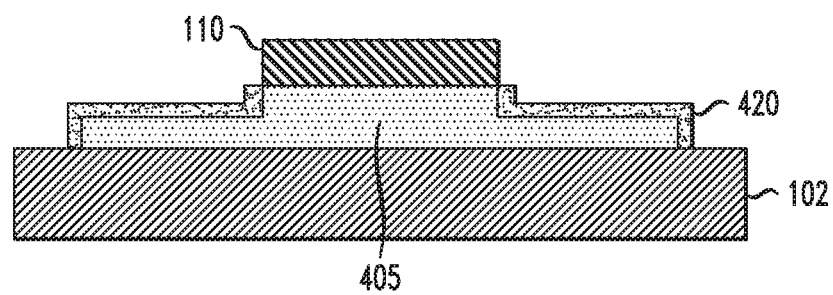
FIG. 16 is a cross-sectional view illustrating formation of moderately doped c-Si:H on exposed parts of the semiconductor layer in a method of manufacturing a semiconductor device, according to an exemplary embodiment of the present invention.

FIG. 16 is a cross-sectional view illustrating formation of moderately doped Si:H on exposed parts of the semiconductor layer in a method of manufacturing a semiconductor device, according to an exemplary embodiment of the present invention. Referring to FIG. 16, similar to the processing described in connection with FIG. 4, a moderately doped c-Si:H epitaxial layer 420 is selectively formed on the exposed portions of the semiconductor layer 405. Non-crystalline hydrogenated silicon (not shown) is formed on other portions, such as insulating layer 102 and the dielectric mask 110. Similar to the growth of layers 120 and 125 discussed in connection with FIG. 4, the hydrogenated silicon (Si:H) is grown, for example, using PECVD, which results in crystalline (single or poly) growth on the exposed parts on the semiconductor layer 405 and in non-crystalline growth elsewhere. Other techniques such as, for example, hot-wire chemical vapor deposition (HWCVD) may also be used to grow Si:H. The non-crystalline portions of Si:H are selectively removed using an appropriate dry or wet etch. The dielectric mask 110 is then removed using an etch chemistry that does not attack the remaining epitaxial c-Si:H 420, such as, for example, hydrofluoric acid (HF).

Figure 17:
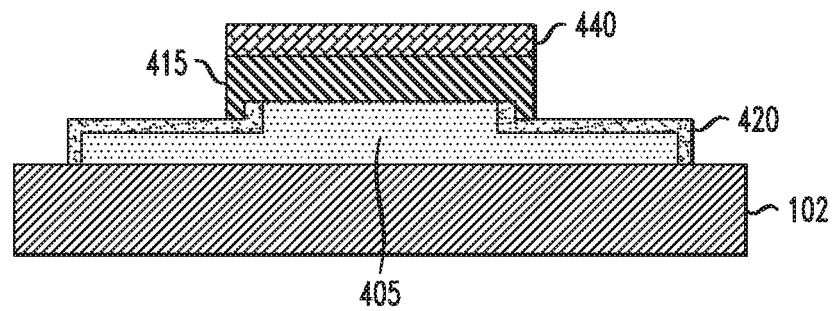
FIG. 17 is a cross-sectional view illustrating deposition and patterning of a gate dielectric layer and a gate electrode in a method of manufacturing a semiconductor device, according to an exemplary embodiment of the present invention.

FIG. 17 is a cross-sectional view illustrating deposition and patterning of a gate dielectric layer and a gate electrode in a method of manufacturing a semiconductor device, according to an exemplary embodiment of the present invention. Referring to FIG. 17, similar to the processing described in connection with FIG. 8A, gate dielectric and gate electrode materials (e.g., metal) are deposited on the structure of FIG. 16 after removal of the dielectric mask 110 using, for example, deposition techniques including, but not limited to, CVD, PECVD, RFCVD, PVD, ALD, MLD, MBD, PLD, LSMCD, and/or sputtering. The deposited layers are patterned into the gate dielectric 415 and gate electrode 440 using, for example, lithography and etching (e.g., RIE). As can be seen, the gate dielectric 415 is formed over portions of the c-Si:H layer 420. The gate electrode 440 and gate dielectric 415 materials can comprise the same or similar materials as those mentioned above in connection with FIG. 8A.

Figure 18:
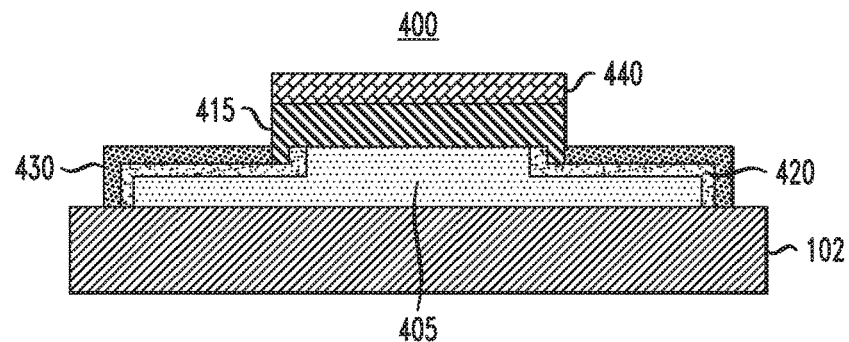
FIG. 18 is a cross-sectional view illustrating selective formation of a highly doped c-Si:H layer in a method of manufacturing a semiconductor device, according to an exemplary embodiment of the present invention.

FIG. 18 is a cross-sectional view illustrating selective formation of a highly doped Si:H layer in a method of manufacturing a semiconductor device, according to an exemplary embodiment of the present invention. Referring to FIG. 18, a highly doped c-Si:H epitaxial layer 430 is then selectively formed on the exposed portions of the moderately doped c-Si:H layer 420, similar to the formation of the layer 130 described in connection with FIG. 8B.

Figure 19:
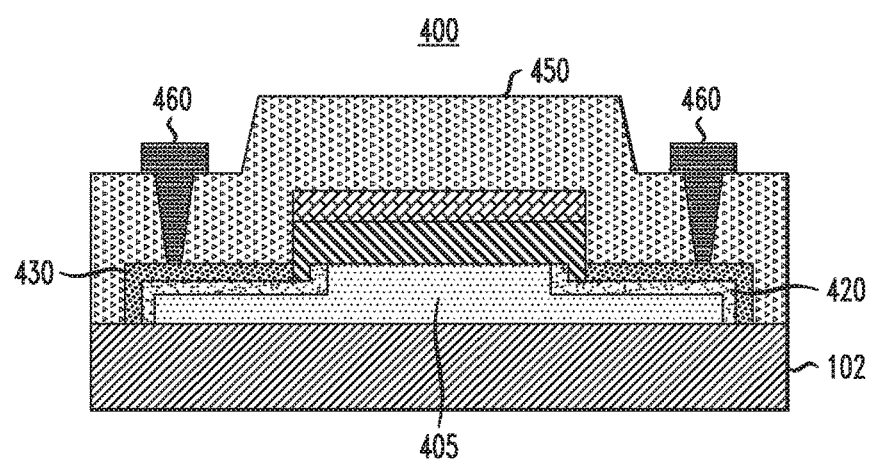
FIG. 19 is a cross-sectional view illustrating formation of a passivation layer and source/drain contact regions in a method of manufacturing a semiconductor device, according to an exemplary embodiment of the present invention.

FIG. 19 is a cross-sectional view illustrating formation of a passivation layer and source/drain contact regions in a method of manufacturing a semiconductor device, according to an exemplary embodiment of the present invention. Referring to FIG. 19, a passivation layer 450 and source/drain contacts 460 to the highly-doped c-Si:H layer 430 are formed using the same or similar steps and materials as those described in connection with the embodiments of FIGS. 9, 11 and 14.

Figure 20:
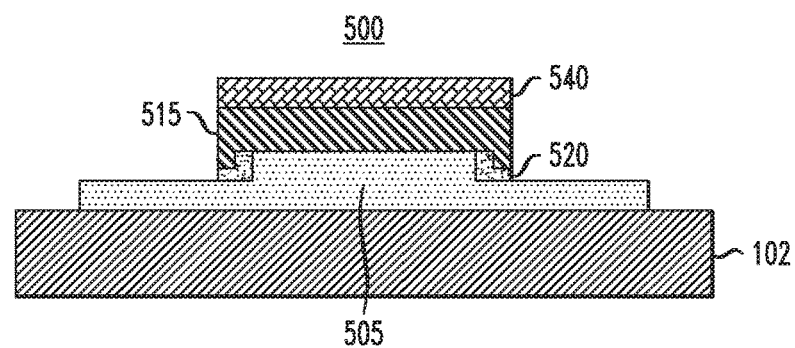
FIG. 20 is a cross-sectional view illustrating removal of portions of the moderately doped c-Si:H layer in a method of manufacturing a semiconductor device, according to an exemplary embodiment of the present invention.

FIG. 20 is a cross-sectional view illustrating removal of portions of the moderately doped Si:H layer in a method of manufacturing a semiconductor device, according to an exemplary embodiment of the present invention. Referring to FIG. 20, in connection with a device 500, following processing from FIG. 17, the exposed portions of a moderately doped c-Si:H layer 520 not covered by a gate dielectric layer 515 are removed using an etch selective to the semiconductor layer 505 (e.g., LTPS), such as, but not necessarily limited to, 1M KOH solution.

Figure 21:
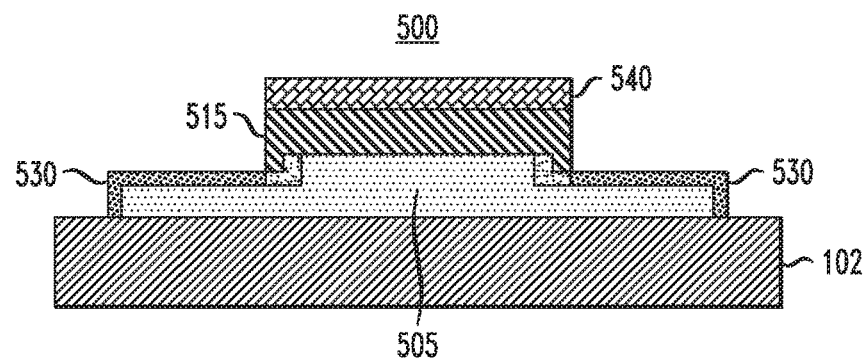
FIG. 21 is a cross-sectional view illustrating selective formation of a highly doped c-Si:H layer in a method of manufacturing a semiconductor device, according to an exemplary embodiment of the present invention.

FIG. 21 is a cross-sectional view illustrating selective formation of a highly doped Si:H layer in a method of manufacturing a semiconductor device, according to an exemplary embodiment of the present invention. Referring to FIG. 21, a highly-doped c-Si:H epitaxial layer 530 is then selectively formed on the exposed portions of the semiconductor layer 505 similar to the formation of the layer 230 described in connection with FIG. 10B. As noted above, in some embodiments, this approach allows growth of a thicker highly doped c-Si:H layer than when the exposed portions of the moderately doped c-Si:H layer are not removed, causing lower S/D series resistance.

Figure 22:
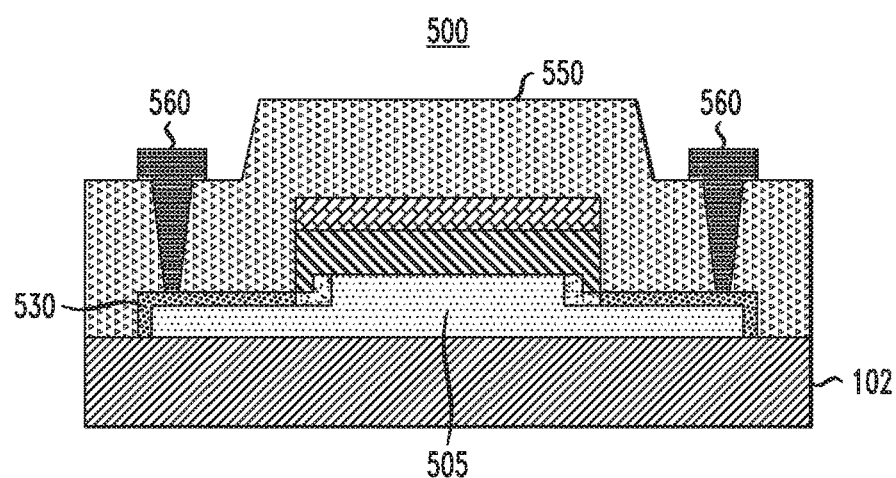
FIG. 22 is a cross-sectional view illustrating formation of a passivation layer and source/drain contact regions in a method of manufacturing a semiconductor device, according to an exemplary embodiment of the present invention.

FIG. 22 is a cross-sectional view illustrating formation of a passivation layer and source/drain contact regions in a method of manufacturing a semiconductor device, according to an exemplary embodiment of the present invention. Referring to FIG. 22, a passivation layer 550 and source/drain contacts 560 to the highly-doped c-Si:H layer 530 are formed using the same or similar steps and materials as those described in connection with the embodiments of FIGS. 9, 11, 14 and 19.

Figure 23:
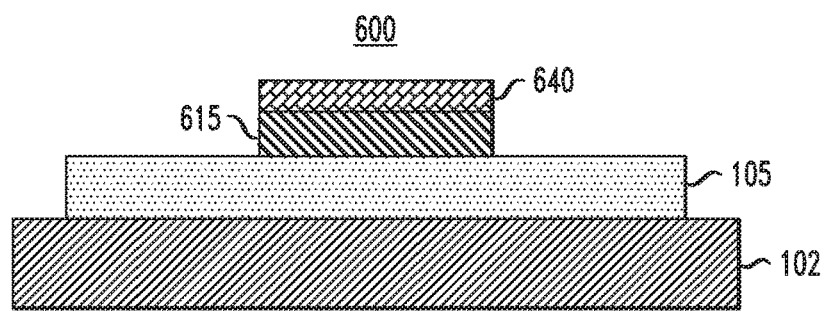
FIG. 23 is a cross-sectional view illustrating deposition and patterning of a gate dielectric and gate electrode in a method of manufacturing a semiconductor device, according to an exemplary embodiment of the present invention.

FIG. 23 is a cross-sectional view illustrating deposition and patterning of a gate dielectric and gate electrode in a method of manufacturing a semiconductor device, according to an exemplary embodiment of the present invention. Referring to FIG. 23, following the processing in connection with FIG. 2, gate dielectric and gate electrode materials (e.g., metal) are deposited on the structure of FIG. 2, for example, deposition techniques including, but not limited to, CVD, PECVD, RFCVD, PVD, ALD, MLD, MBD, PLD, LSMCD, and/or sputtering. similar to the processing described in connection with FIG. 8A, the deposited layers are patterned into the gate dielectric 615 and gate electrode 640 using, for example, lithography and etching (e.g., RIE). The gate electrode 640 and gate dielectric 615 materials can comprise the same or similar materials as those mentioned above in connection with FIG. 8A.

As noted above, in some embodiments, an additional dielectric layer is deposited on the gate electrode, to form a dielectric/metal/dielectric tri-layer to protect the metal against wet cleaning and/or HF dip steps that may be used subsequently to remove organic residues from lithography or native/chemical oxide layers.

Figure 24:
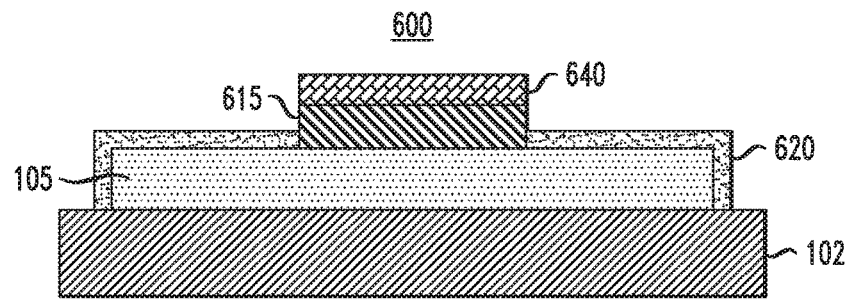
FIG. 24 is a cross-sectional view illustrating formation of moderately doped c-Si:H on exposed parts of the semiconductor layer in a method of manufacturing a semiconductor device, according to an exemplary embodiment of the present invention.

FIG. 24 is a cross-sectional view illustrating formation of moderately doped Si:H on exposed parts of the semiconductor layer in a method of manufacturing a semiconductor device, according to an exemplary embodiment of the present invention. Referring to FIG. 24, similar to the processing described in connection with FIG. 4, a moderately doped c-Si:H epitaxial layer 620 is selectively formed on the exposed portions of the semiconductor layer 105. Non-crystalline hydrogenated silicon (not shown) is formed on other portions, such as insulating layer 102 and the gate electrode 640. Similar to the growth of layers 120 and 125 discussed in connection with FIG. 4, the hydrogenated silicon (Si:H) is grown, for example, using PECVD, which results in crystalline (single or poly) growth on the exposed parts on the semiconductor layer 105 and in non-crystalline growth elsewhere. Other techniques such as, for example, hot-wire chemical vapor deposition (HWCVD) may also be used to grow Si:H. The non-crystalline portions of Si:H are selectively removed using an appropriate dry or wet etch.

Figure 25:
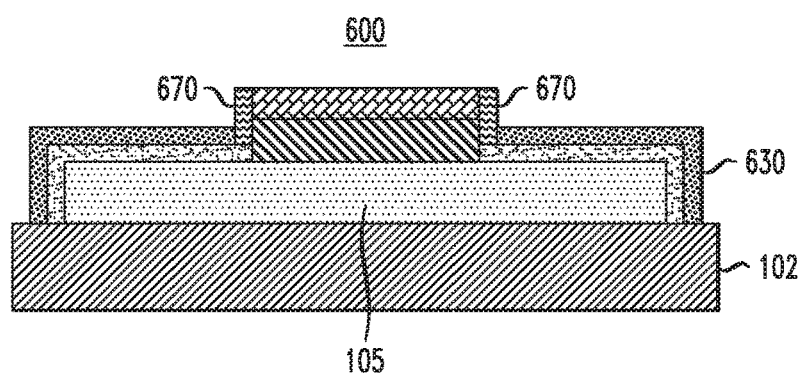
FIG. 25 is a cross-sectional view illustrating spacer formation and selective formation of a highly doped c-Si:H layer in a method of manufacturing a semiconductor device, according to an exemplary embodiment of the present invention.

FIG. 25 is a cross-sectional view illustrating spacer formation and selective formation of a highly doped Si:H layer in a method of manufacturing a semiconductor device, according to an exemplary embodiment of the present invention. Referring to FIG. 25, spacers 670 are formed using techniques such as, for example, conformal deposition of a dielectric material, followed by anisotropic (i.e., directional) etching, such as RIE in plasma to remove portions of the deposited dielectric material and pattern the dielectric material into the spacers 670.

The dielectric spacer material, such as, for example, SiOCN, SiBCN, SiOC, SiCN, SiBN, or SiON, is conformally deposited on exposed surfaces, including on a top surface of the gate electrode 640, sidewalls of the gate electrode and gate dielectric layers 640, 615 and the moderately-doped c-Si:H epitaxial layer 620. The spacer material can be deposited using conformal deposition techniques, including, but not limited to, atomic layer deposition (ALD) or molecular layer deposition (MLD). Self-aligned processes are similar to the non-self-aligned processes described herein except that the LDD region (e.g., moderately doped c-Si:H) is defined using spacers (which may be sub-lithographic) instead of using lithography.

Following anisotropic etching to form the spacers 670, a highly doped c-Si:H epitaxial layer 630 is then selectively formed on the exposed portions of the moderately doped c-Si:H layer 620, similar to the formation of the layer 130 described in connection with FIG. 8B.

Figure 26A:
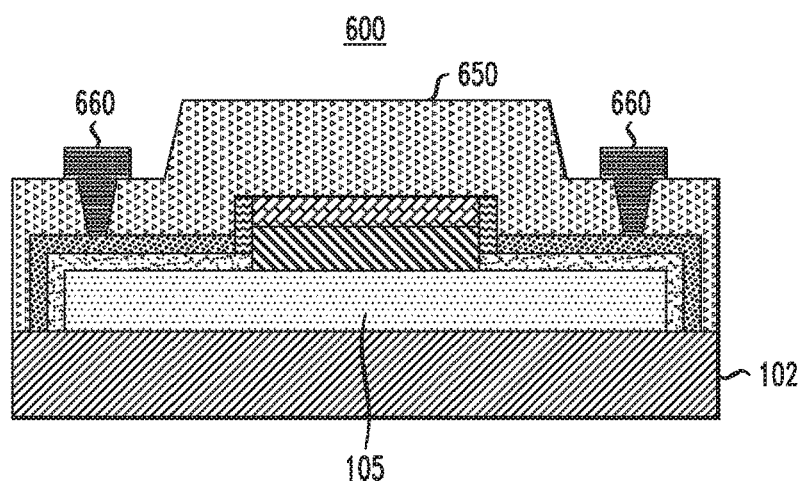
FIG. 26A is a cross-sectional view illustrating formation of a passivation layer and source/drain contact regions in a method of manufacturing a semiconductor device, according to an exemplary embodiment of the present invention.

FIG. 26A is a cross-sectional view illustrating formation of a passivation layer and source/drain contact regions in a method of manufacturing a semiconductor device, according to an exemplary embodiment of the present invention. Referring to FIG. 26A, a passivation layer 650 and source/drain contacts 660 to the highly-doped c-Si:H layer 630 are formed using the same or similar steps and materials as those described in connection with the embodiments of FIGS. 9, 11, 14, 19 and 22.

Figure 26B:
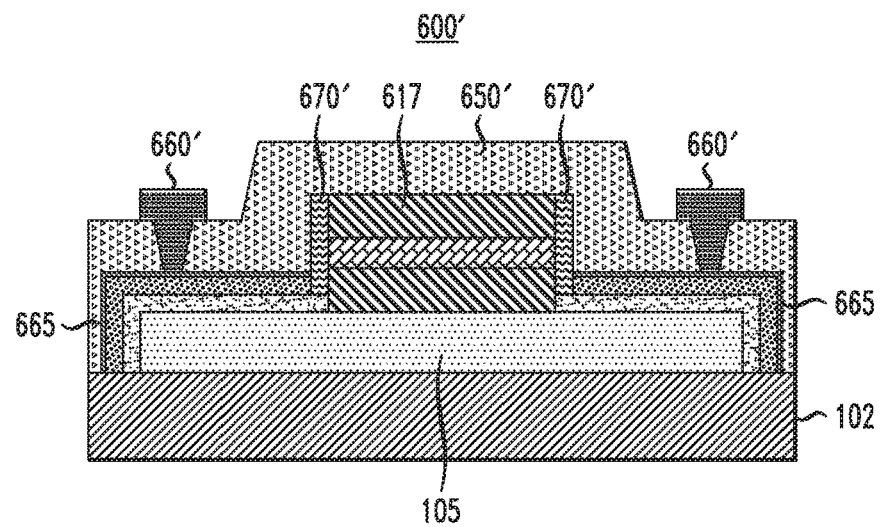
FIG. 26B is a cross-sectional view illustrating an alternate structure to that shown in FIG. 26A including a self-aligned silicide layer formed on the highly doped c-Si:H layer, and an additional dielectric layer on the gate electrode, according to an exemplary embodiment of the present invention.

FIG. 26B is a cross-sectional view illustrating an alternate structure to that shown in FIG. 26A including a self-aligned silicide layer formed on the highly doped Si:H layer, and an additional dielectric layer on the gate electrode, according to an exemplary embodiment of the present invention. Referring to FIG. 26B, in connection with a device 600', a self-aligned silicide layer 665 may be formed on the highly-doped c-Si:H layer 630 before the processing to form the passivation layer 650' and source/drain contacts 660'. The passivation layer 650' and the source/drain contacts 660' are formed by techniques similar to the processing to form the passivation layer 650 and source/drain contacts 660 described in connection with FIG. 26A. Formation of the silicide 665 includes blanket metal deposition, a chemical reaction between the deposited metal and c-Si:H, and selective removal of unreacted (unsilicidized) portions of the metal with respect to the silicide, which removes the metal from other areas so that the silicide layer 665 on the highly doped c-Si:H layer 630 remains as illustrated in the final structure. The metals used for silicide formation include, but are not limited to, chromium (Cr), nickel (Ni) and titanium (Ti).

The top dielectric layer 617 on the gate electrode 640, which was optional in previously described examples, is required to avoid etching the gate electrode 640 during selective removal of the unreacted portions of the metal with respect to the silicide. However, the top dielectric layer 617 may not be required if the gate electrode 640 is comprised of a different material than the deposited metal for the silicide and the etch chemistry used is selective to the metal of the gate electrode 640. The height of the spacers 670' is increased compared with the height of the spacers 670 due to the addition of top dielectric layer 617.

In some embodiments, the chemical reaction between the deposited metal and c-Si:H is facilitated by post-deposition annealing or by using a substrate temperature above room temperature during metal deposition. In one example, annealing is performed at temperatures in the range of 100° C. to 200° C. for 5-15 minutes. In other embodiments, no heating or annealing is used. In some embodiments, the selective removal of the unreacted portions of the metal with respect to the silicide is facilitated by the poor adhesion of metal to dielectrics. In one example where Cr is used for silicide formation, selective removal is performed in a mixture of ceric ammonium nitrate and dilute perchloric acid.

Figure 27A:
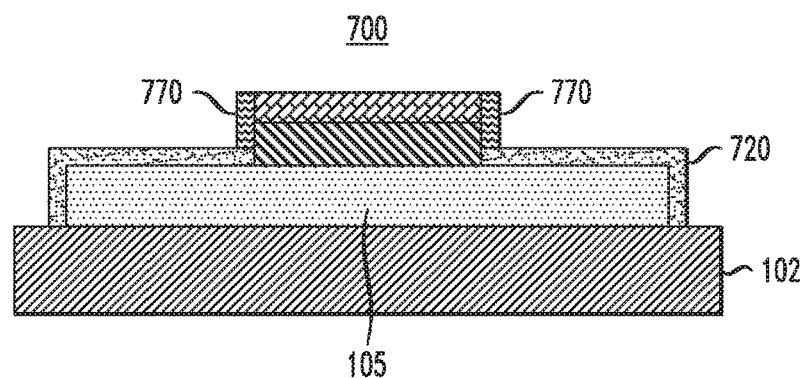
FIG. 27A is a cross-sectional view illustrating spacer formation in a method of manufacturing a semiconductor device, according to an exemplary embodiment of the present invention.

FIG. 27A is a cross-sectional view illustrating spacer formation in a method of manufacturing a semiconductor device, according to an exemplary embodiment of the present invention. Referring to FIG. 27A, following the processing described in connection with FIG. 25, for a device 700, spacers 770 are formed using techniques and materials described in connection with FIG. 25, such as, for example, conformal deposition of a dielectric material, followed by anisotropic (i.e., directional) etching to pattern the dielectric material into the spacers 770.

Figure 27B:
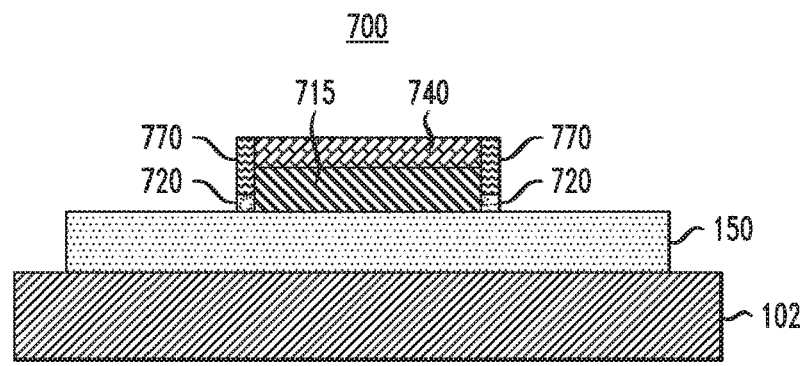
FIG. 27B is a cross-sectional view illustrating removal of portions of the moderately doped c-Si:H layer in a method of manufacturing a semiconductor device, according to an exemplary embodiment of the present invention.

FIG. 27B is a cross-sectional view illustrating removal of portions of the moderately doped Si:H layer in a method of manufacturing a semiconductor device, according to an exemplary embodiment of the present invention. Referring to FIG. 27B, following anisotropic etching to form the spacers 770, the exposed portions of the moderately doped c-Si:H layer 720 are etched, for example, with 1M KOH before growing highly doped c-Si:H.

Figure 28:
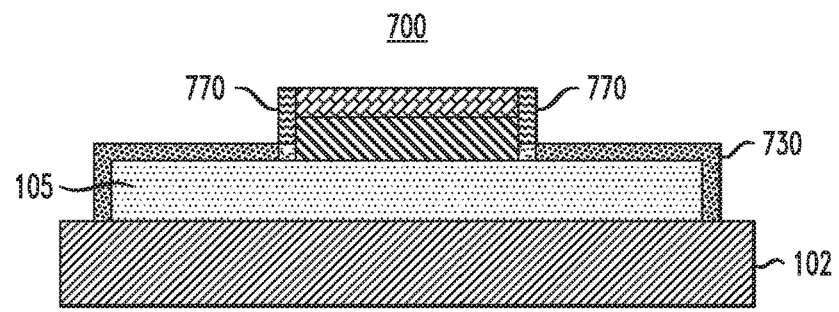
FIG. 28 is a cross-sectional view illustrating selective formation of a highly doped c-Si:H layer in a method of manufacturing a semiconductor device, according to an exemplary embodiment of the present invention.

FIG. 28 is a cross-sectional view illustrating selective formation of a highly doped Si:H layer in a method of manufacturing a semiconductor device, according to an exemplary embodiment of the present invention. Referring to FIG. 28, a highly-doped c-Si:H epitaxial layer 730 is then selectively formed on the exposed portions of the semiconductor layer 105 similar to the formation of the layer 230 described in connection with FIG. 10B. Similar to the previously described embodiments, this approach can allow growth of a thicker highly doped c-Si:H layer than when the exposed portions of the moderately doped c-Si:H layer are not removed.

Figure 29A:
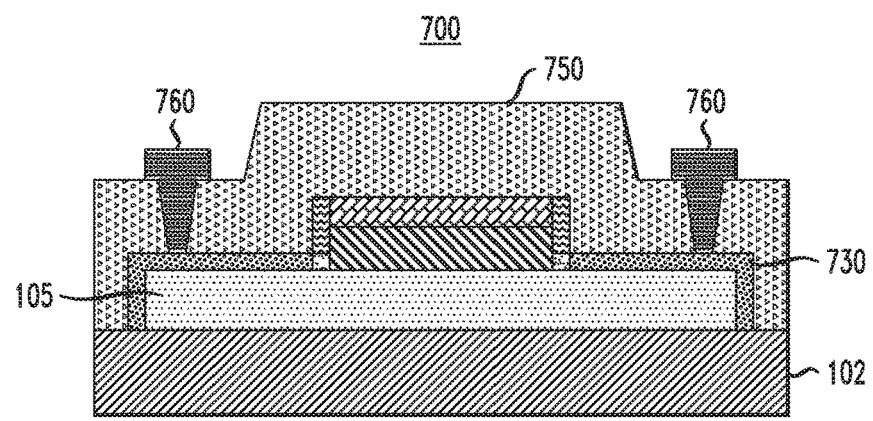
FIG. 29A is a cross-sectional view illustrating formation of a passivation layer and source/drain contact regions in a method of manufacturing a semiconductor device, according to an exemplary embodiment of the present invention.

FIG. 29A is a cross-sectional view illustrating formation of a passivation layer and source/drain contact regions in a method of manufacturing a semiconductor device, according to an exemplary embodiment of the present invention. Referring to FIG. 29A, a passivation layer 750 and source/drain contacts 760 to the highly-doped c-Si:H layer 730 are formed using the same or similar steps and materials as those described in connection with the embodiments of FIGS. 9, 11, 14, 19, 22 and 26A.

Figure 29B:
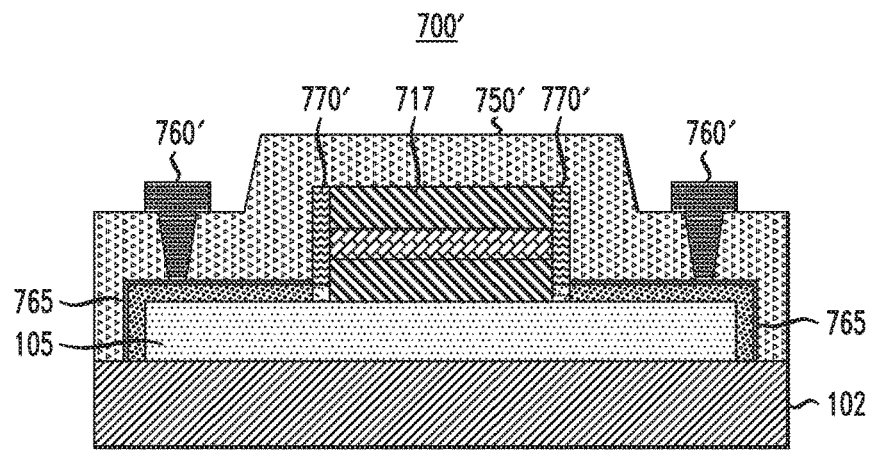
FIG. 29B is a cross-sectional view illustrating an alternate structure to that shown in FIG. 29A including a self-aligned silicide layer formed on the highly doped c-Si:H layer, and an additional dielectric layer on the gate electrode, according to an exemplary embodiment of the present invention.

FIG. 29B is a cross-sectional view illustrating an alternate structure to that shown in FIG. 29A including a self-aligned silicide layer formed on the highly doped Si:H layer, and an additional dielectric layer on the gate electrode, according to an exemplary embodiment of the present invention. Referring to FIG. 29B, similar to FIG. 26B, in connection with a device 700', a self-aligned silicide layer 765 may be formed on the highly-doped c-Si:H layer 730 before the processing to form the passivation layer 750' and source/drain contacts 760'. The passivation layer 750' and the source/drain contacts 760' are formed by techniques similar to the processing to form the passivation layer 750 and source/drain contacts 760 described in connection with FIG. 29A. The height of the spacers 770' is increased compared with the height of the spacers 770 due to the addition of top dielectric layer 717.

Figure 30:
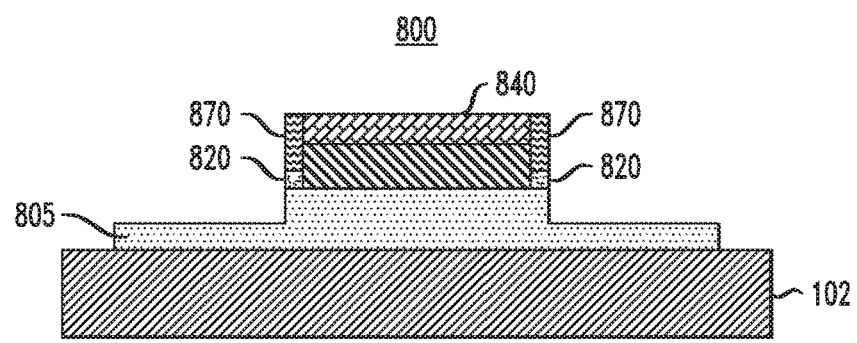
FIG. 30 is a cross-sectional view illustrating removal of portions of the semiconductor layer in a method of manufacturing a semiconductor device, according to an exemplary embodiment of the present invention.

FIG. 30 is a cross-sectional view illustrating removal of portions of the semiconductor layer in a method of manufacturing a semiconductor device, according to an exemplary embodiment of the present invention. Referring to FIG. 30, in connection with a device 800, following processing from FIG. 27A, the exposed portions of the moderately doped c-Si:H layer 820 not covered by the spacers 870 are etched using an etch which is not selective to the semiconductor layer 805 (e.g., LTPS), such as, but not necessarily limited to, TMAH, CF$_4$ plasma, SF$_6$/CHF$_3$ plasma or SF$_6$/O$_2$ plasma. As can be seen in FIG. 30, the semiconductor layer 805 is partially etched, thereby recessing portions of the semiconductor layer 805 that were under the exposed portions of the moderately doped c-Si:H layer 820.

Figure 31:
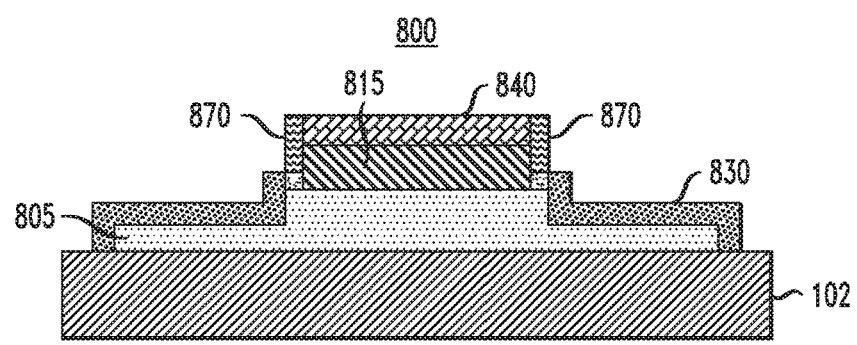
FIG. 31 is a cross-sectional view illustrating selective formation of a highly doped c-Si:H layer in a method of manufacturing a semiconductor device, according to an exemplary embodiment of the present invention.

FIG. 31 is a cross-sectional view illustrating selective formation of a highly doped Si:H layer in a method of manufacturing a semiconductor device, according to an exemplary embodiment of the present invention. Referring to FIG. 31, a highly doped c-Si:H epitaxial layer 830 is then selectively formed similar to the formation of the layer 330 described in connection with FIG. 13. As noted in connection with FIG. 13, in some embodiments, this approach allows growth of a thicker highly doped c-Si:H layer, which reduces S/D series resistance. The recessed structure also reduces current crowding and further reduces S/D series resistance, in some embodiments.

Figure 32A:
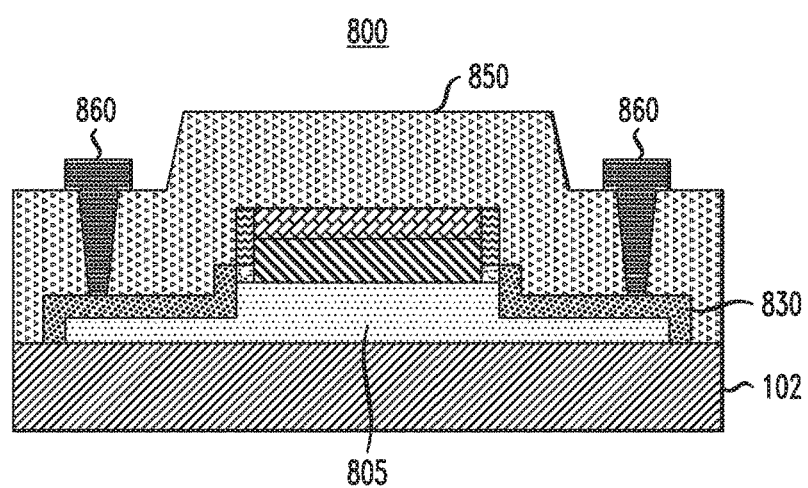
FIG. 32A is a cross-sectional view illustrating formation of a passivation layer and source/drain contact regions in a method of manufacturing a semiconductor device, according to an exemplary embodiment of the present invention.

FIG. 32A is a cross-sectional view illustrating formation of a passivation layer and source/drain contact regions in a method of manufacturing a semiconductor device, according to an exemplary embodiment of the present invention. Referring to FIG. 32A, a passivation layer 850 and source/drain contacts 860 to the highly-doped c-Si:H layer 830 are formed using the same or similar steps and materials as those described in connection with the embodiments of FIGS. 9, 11, 14, 19, 22, 26A and 29A.

Figure 32B:
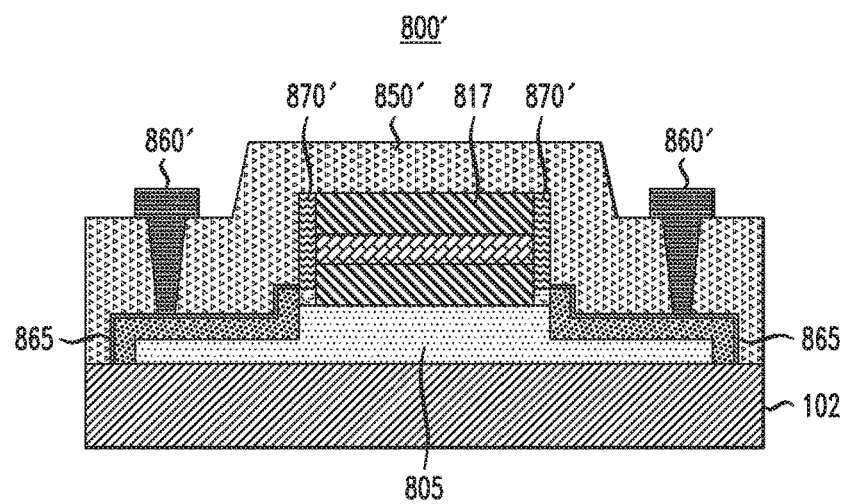
FIG. 32B is a cross-sectional view illustrating an alternate structure to that shown in FIG. 32A including a self-aligned silicide layer formed on the highly doped c-Si:H layer, and an additional dielectric layer on the gate electrode, according to an exemplary embodiment of the present invention.

FIG. 32B is a cross-sectional view illustrating an alternate structure to that shown in FIG. 32A including a self-aligned silicide layer formed on the highly doped Si:H layer, and an additional dielectric layer on the gate electrode, according to an exemplary embodiment of the present invention. Referring to FIG. 32B, similar to FIGS. 26B and 29B, in connection with a device 800', a self-aligned silicide layer 865 may be formed on the highly-doped c-Si:H layer 830 before the processing to form the passivation layer 850' and source/drain contacts 860'. The passivation layer 850' and the source/drain contacts 860' are formed by techniques similar to the processing to form the passivation layer 850 and source/drain contacts 860 described in connection with FIG. 32A. The height of the spacers 870' is increased compared with the height of the spacers 870 due to the addition of top dielectric layer 817.

Figure 33A:
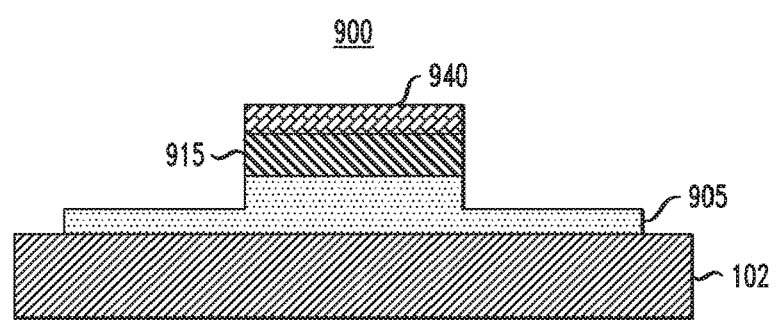
FIG. 33A is a cross-sectional view illustrating removal of portions of the semiconductor layer in a method of manufacturing a semiconductor device, according to an exemplary embodiment of the present invention.

FIG. 33A is a cross-sectional view illustrating removal of portions of the semiconductor layer in a method of manufacturing a semiconductor device, according to an exemplary embodiment of the present invention. Referring to FIG. 33A, in connection with a device 900, following processing from FIG. 23, the semiconductor layer 905 is recessed after forming a gate stack using an etch chemistry including, but not necessarily limited to, TMAH, CF$_4$ plasma, SF$_6$/CHF$_3$ plasma or SF$_6$/O$_2$ plasma. As can be seen in FIG. 33A, the semiconductor layer 905 is partially etched, thereby recessing portions of the semiconductor layer not under the gate dielectric 915.

Figure 33B:
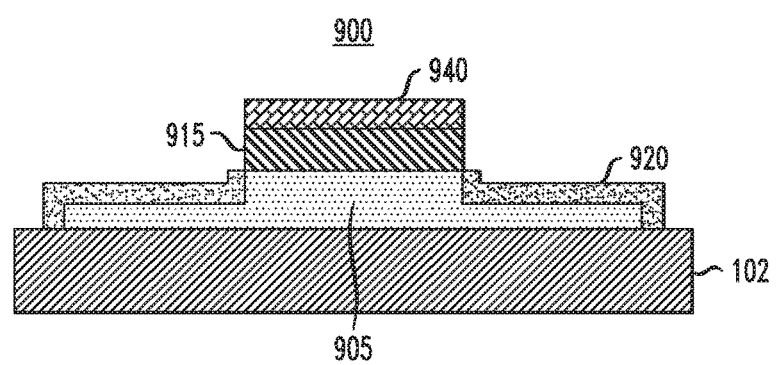
FIG. 33B is a cross-sectional view illustrating formation of moderately doped c-Si:H on exposed parts of the semiconductor layer in a method of manufacturing a semiconductor device, according to an exemplary embodiment of the present invention.

FIG. 33B is a cross-sectional view illustrating formation of moderately doped Si:H on exposed parts of the semiconductor layer in a method of manufacturing a semiconductor device, according to an exemplary embodiment of the present invention. Referring to FIG. 33B, similar to the processing described in connection with FIG. 16, a moderately doped c-Si:H epitaxial layer 920 is selectively formed on the exposed portions of the semiconductor layer 905.

Figure 34:
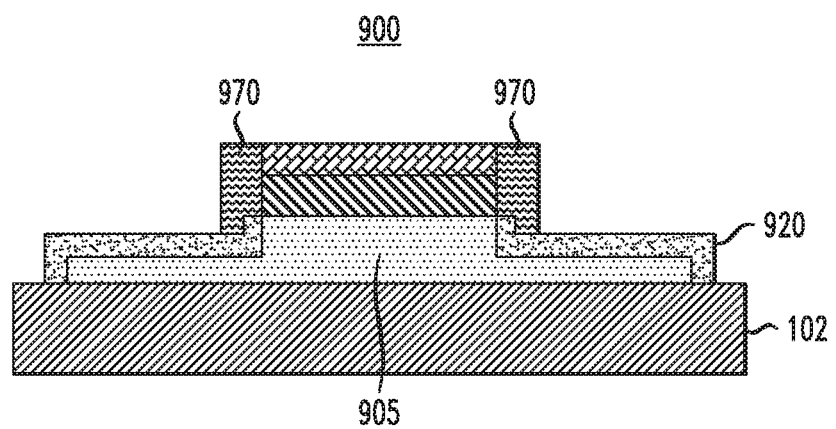
FIG. 34 is a cross-sectional view illustrating spacer formation in a method of manufacturing a semiconductor device, according to an exemplary embodiment of the present invention.

FIG. 34 is a cross-sectional view illustrating spacer formation in a method of manufacturing a semiconductor device, according to an exemplary embodiment of the present invention. Referring to FIG. 34, spacers 970 are formed using techniques and materials described in connection with FIGS. 25 and 27A, such as, for example, conformal deposition of a dielectric material, followed by anisotropic (i.e., directional) etching to pattern the dielectric material into the spacers 970. As shown in FIG. 34, the spacers 970 cover portions of the moderately doped c-Si:H epitaxial layer 920.

Figure 35:
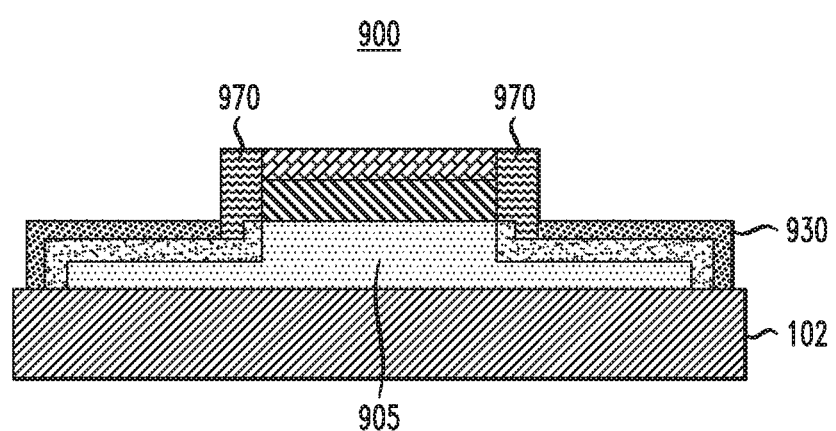
FIG. 35 is a cross-sectional view illustrating selective formation of a highly doped c-Si:H layer in a method of manufacturing a semiconductor device, according to an exemplary embodiment of the present invention.

FIG. 35 is a cross-sectional view illustrating selective formation of a highly doped Si:H layer in a method of manufacturing a semiconductor device, according to an exemplary embodiment of the present invention. Referring to FIG. 35, following anisotropic etching to form the spacers 970, a highly doped c-Si:H epitaxial layer 930 is then selectively formed on the exposed portions of the moderately doped c-Si:H layer 920, similar to the formation of the layer 130 described in connection with FIG. 8B.

Figure 36A:
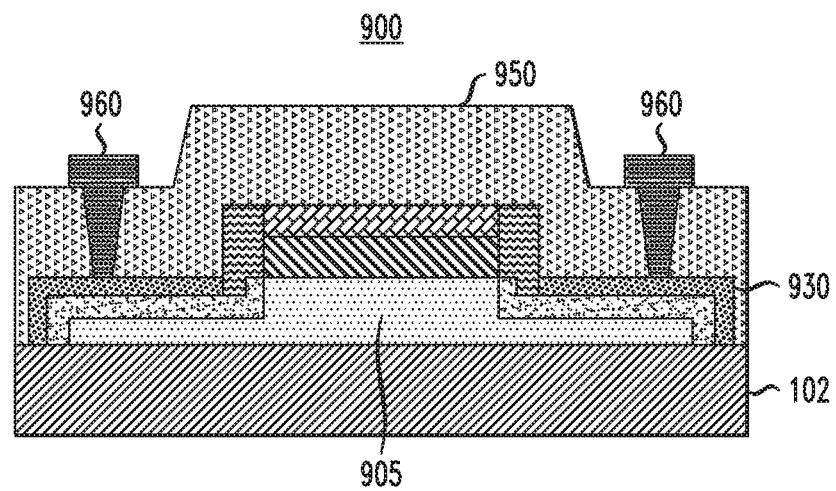
FIG. 36A is a cross-sectional view illustrating formation of a passivation layer and source/drain contact regions in a method of manufacturing a semiconductor device, according to an exemplary embodiment of the present invention.

FIG. 36A is a cross-sectional view illustrating formation of a passivation layer and source/drain contact regions in a method of manufacturing a semiconductor device, according to an exemplary embodiment of the present invention. Referring to FIG. 36A, a passivation layer 950 and source/drain contacts 960 to the highly-doped c-Si:H layer 930 are formed using the same or similar steps and materials as those described in connection with the embodiments of FIGS. 9, 11, 14, 19, 22, 26A, 29A and 32A.

Figure 36B:
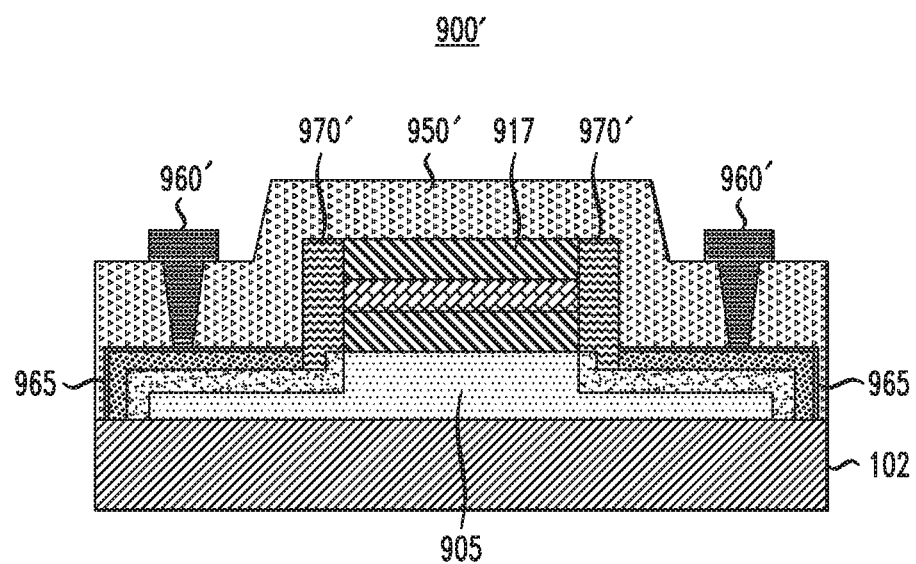
FIG. 36B is a cross-sectional view illustrating an alternate structure to that shown in FIG. 36A including a self-aligned silicide layer formed on the highly doped c-Si:H layer, and an additional dielectric layer on the gate electrode, according to an exemplary embodiment of the present invention.

FIG. 36B is a cross-sectional view illustrating an alternate structure to that shown in FIG. 36A including a self-aligned silicide layer formed on the highly doped Si:H layer, and an additional dielectric layer on the gate electrode, according to an exemplary embodiment of the present invention. Referring to FIG. 36B, similar to FIGS. 26B, 29B and 32B, in connection with a device 900', a self-aligned silicide layer 965 may be formed on the highly-doped c-Si:H layer 930 before the processing to form the passivation layer 950' and source/drain contacts 960'. The passivation layer 950' and the source/drain contacts 960' are formed by techniques similar to the processing to form the passivation layer 950 and source/drain contacts 960 described in connection with FIG. 36A. The height of the spacers 970' is increased compared with the height of the spacers 970 due to the addition of top dielectric layer 917.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
   a semiconductor layer on an insulating layer;
   a first doped layer on the semiconductor layer, wherein the first doped layer has a first doping concentration;
   a second doped layer on the semiconductor layer, wherein the second doped layer has a second doping concentration higher than the first doping concentration;
   a gate dielectric over an active region of the semiconductor layer;
   a gate electrode on the gate dielectric; and
   one or more source/drain contacts to the second doped layer;

wherein the first doped layer comprises a lightly doped drain (LDD) region and the second doped layer comprises a source/drain region; and wherein the first and second doped layers comprise crystalline hydrogenated silicon (c-Si:H).

2. The semiconductor device according to claim 1, wherein the crystalline hydrogenated silicon (c-Si:H) comprises about 5 atomic percent hydrogen to about 40 atomic percent hydrogen.

3. The semiconductor device according to claim 1, wherein the semiconductor layer comprises poly-silicon.

4. The semiconductor device according to claim 1, wherein the first doping concentration is in the range of about $5 \times 10^{17}$ cm$^{-3}$ to about $1 \times 10^{19}$ cm$^{-3}$.

5. The semiconductor device according to claim 4, wherein the second doping concentration is in the range of about $1 \times 10^{19}$ cm$^{-3}$ to about $5 \times 10^{20}$ cm$^{-3}$.

6. The semiconductor device according to claim 1, wherein the second doped layer is disposed on the first doped layer.

7. The semiconductor device according to claim 1, wherein the gate dielectric covers at least a portion of the first doped layer.

8. The semiconductor device according to claim 7, wherein the gate dielectric covers an entire portion of the first doped layer.

9. The semiconductor device according to claim 1, wherein at least one of the first and second doped layers are disposed on a top surface and a side surface of the semiconductor layer.

10. The semiconductor device according to claim 1, wherein a portion of the semiconductor layer is recessed.

11. The semiconductor device according to claim 10, wherein at least one of the first and second doped layers are disposed on the recessed portion of the semiconductor layer.

12. The semiconductor device according to claim 1, further comprising a passivation layer disposed on the second doped layer, wherein the one or more source/drain contacts are disposed through the passivation layer.

13. A semiconductor device, comprising:
a semiconductor layer on an insulating layer;
a first doped layer on the semiconductor layer, wherein the first doped layer has a first doping concentration;
a second doped layer on the semiconductor layer, wherein the second doped layer has a second doping concentration higher than the first doping concentration;
a gate dielectric over an active region of the semiconductor layer; and
a gate electrode on the gate dielectric;
wherein the second doped layer comprises a source/drain region; and
wherein the first and second doped layers comprise crystalline hydrogenated silicon (c-Si:H).

14. The semiconductor device according to claim 13, wherein the crystalline hydrogenated silicon (c-Si:H) comprises about 5 atomic percent hydrogen to about 40 atomic percent hydrogen.

15. The semiconductor device according to claim 13, wherein the first doping concentration is in the range of about $5 \times 10^{17}$ cm$^{-3}$ to about $1 \times 10^{19}$ cm$^{-3}$.

16. The semiconductor device according to claim 15, wherein the second doping concentration is in the range of about $1 \times 10^{19}$ cm$^{-3}$ to about $5 \times 10^{20}$ cm$^{-3}$.

17. The semiconductor device according to claim 13, wherein the second doped layer is disposed on the first doped layer.

18. The semiconductor device according to claim 13, wherein the gate dielectric covers at least a portion of the first doped layer.

19. The semiconductor device according to claim 13, wherein at least one of the first and second doped layers are disposed on a top surface and a side surface of the semiconductor layer.

20. A semiconductor device, comprising:
a semiconductor layer on an insulating layer;
a first doped layer on the semiconductor layer, wherein the first doped layer has a first doping concentration; and
a second doped layer on the semiconductor layer, wherein the second doped layer has a second doping concentration higher than the first doping concentration;
wherein the first doped layer comprises a lightly doped drain (LDD) region and the second doped layer comprises a source/drain region; and
wherein the first and second doped layers comprise crystalline hydrogenated silicon (c-Si:H).

\* \* \* \* \*